United States Patent
Takahashi (10) Patent No.: US 10,418,904 B2
(45) Date of Patent: Sep. 17, 2019

(54) POWER CONVERTER HAVING PARALLEL CONNECTED POWER CONVERSION CIRCUITS WITH TEMPERATURES BASED CONTROL

(71) Applicant: TOYOTA JIDOSHA KABUSHIKI KAISHA, Toyota-shi, Aichi (JP)

(72) Inventor: Masahiro Takahashi, Nagakute (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 16/106,783

(22) Filed: Aug. 21, 2018

(65) Prior Publication Data

US 2019/0109540 A1    Apr. 11, 2019

(30) Foreign Application Priority Data

Oct. 10, 2017  (JP) .................................. 2017-196983

(51) Int. Cl.
| | |
|---|---|
| *H02M 7/521* | (2006.01) |
| *H02M 3/158* | (2006.01) |
| *B60L 11/18* | (2006.01) |
| *H05K 7/20* | (2006.01) |
| *B60L 3/00* | (2019.01) |
| *H02M 1/32* | (2007.01) |

(52) U.S. Cl.
CPC .......... *H02M 3/1584* (2013.01); *B60L 3/003* (2013.01); *B60L 11/1803* (2013.01); *B60L 11/1887* (2013.01); *B60L 11/1892* (2013.01); *H05K 7/2089* (2013.01); *B60L 2210/40* (2013.01); *B60L 2240/36* (2013.01); *H02M 7/521* (2013.01); *H02M 2001/327* (2013.01)

(58) Field of Classification Search
CPC ............ H02M 1/32; H02M 2001/327; H02M 3/1584; H02M 2003/1586
USPC .................. 323/268, 271, 272; 363/50, 56.03
See application file for complete search history.

(56) References Cited

U.S. PATENT DOCUMENTS

| | | | |
|---|---|---|---|
| 2009/0243386 A1* | 10/2009 | Mimatsu ................. | B60L 11/12 307/9.1 |
| 2012/0086417 A1 | 4/2012 | Osada et al. | |
| 2014/0092655 A1* | 4/2014 | Igarashi .................. | B60L 3/003 363/56.03 |
| 2016/0218621 A1* | 7/2016 | Hayashi ................... | G01K 7/01 |
| 2016/0260650 A1* | 9/2016 | Taguchi ................ | H01L 23/367 |
| 2018/0145683 A1* | 5/2018 | Shimizu ................. | H03K 17/06 |

FOREIGN PATENT DOCUMENTS

| | | |
|---|---|---|
| JP | 2007-116834 A | 5/2007 |
| JP | 2009-118641 A | 5/2009 |
| WO | 2010/140228 A1 | 12/2010 |

* cited by examiner

Primary Examiner — Alex Torres-Rivera
(74) Attorney, Agent, or Firm — Oliff PLC (57) ABSTRACT

A power converter may include a plurality of power conversion circuits, a plurality of temperature sensors, and a controller. Each of the power conversion circuits may include a switching element. The plurality of power conversion circuits may be connected in parallel. Each of the temperature sensors may measure a temperature of one of the switching elements. The controller may select the power conversion circuit to be driven in an ascending order of the temperatures of the switching elements measured by the temperature sensors based on a supplied current value Iin supplied to the power converter.

4 Claims, 8 Drawing Sheets

POWER CONVERTER HAVING PARALLEL CONNECTED POWER CONVERSION CIRCUITS WITH TEMPERATURES BASED CONTROL

CROSS-REFERENCE

This application claims priority to Japanese patent application No. 2017-196983, filed on Oct. 10, 2017, the entire contents of which are incorporated herein by reference.

TECHNICAL FIELD

The disclosure herewith relates to a power converter in which a plurality of power conversion circuits is connected in parallel.

BACKGROUND

A power converter in which a plurality of power conversion circuits is connected in parallel is known (for example, JP 2009-118641A, JP 2007-116834A, and WO 2010/140228 A1). Such a power converter may be called a multi-phase converter. In a multi-phase converter, each power conversion circuit may simply be termed "a phase", In such a power converter, the plurality of power conversion circuits is connected in parallel to distribute load thereon.

In a power converter of JP 2009-118641A, a plurality of bidirectional DC-DC converters (power conversion circuits) is connected in parallel. JP 2007-116834A and WO 2010/140228A1 describe multi-phase converters (power converters) in each of which converters of plural phases are connected in parallel. The multi-phase converter (power converter) of JP 2007-116834A determines a phase number of converters to be driven according to a magnitude of output load or a surrounding temperature. The multi-phase converter (power converter) of WO 2010/140228A1 determines a priority driving phase in an order of high heat diffusing performance. This multi-phase converter (power converter) prevents overheating of each converter by driving a power conversion circuit having a higher heat diffusing performance with priority. As an example of the heat diffusing performance, a temperature increasing rate of a switch portion of each converter is employed.

SUMMARY

A power conversion circuit includes a switching element for converting electric power. The breakdown voltage of the switching element is going down as a temperature of the switching element goes down. In a power converter in which a plurality of power conversion circuits is connected in parallel, a variation in temperatures of switching elements leads to a variation in breakdown voltages among the plurality of power conversion circuits. As a result, a degree of freedom of selecting the power conversion circuits is narrowed. The disclosure herein relates to a power converter provided with a plurality of power conversion circuits connected in parallel, and provides a technique which reduces variation in breakdown voltages which is dependent on temperatures of switching elements.

A power converter disclosed herein may comprise: a plurality of power conversion circuits; a plurality of temperature sensors; and a controller. Each of the power conversion circuits may include a switching element for converting electric power. The plurality of power conversion circuits is connected in parallel. The plurality of temperature sensors may be each configured to measure a temperature of one of the switching elements. The controller may be configured to select a power conversion circuit to be driven from among the power conversion circuits. The controller may be configured to select the power conversion circuit to be driven in an ascending order of the temperatures of the switching elements measured by the temperature sensors, based on one of a supplied current value supplied to the power converter and a target output current value of the power converter. This power converter drives a power conversion circuit including a low-temperature switching element with priority to heat the low-temperature switching element with its own heat generation, and thereby prevents breakdown voltage deterioration. As a result, a temperature-dependent variation in breakdown voltages of the plurality of power conversion circuits can be suppressed. "To select the power conversion circuit to be driven in an ascending order of the temperatures of the switching elements measured by the temperature sensors" more specifically means to select a power conversion circuit to be driven starting from the one including the switching element with the lower temperature.

The controller may be configured to select all of the power conversion circuits when each of the temperatures of all of the switching elements is higher than a predetermined temperature threshold value. If the temperatures of all of the switching elements are higher than the temperature threshold value, the temperature-dependent variation in the breakdown voltages may be small. In such a case, the small variation in the breakdown voltages may be maintained by distributing load among all of the power conversion circuits.

The controller may preferably be configured as follows. The controller may be configured to specify a power conversion circuit in which a temperature of the switching element is lower than a threshold value. The controller may be configured to select the power conversion circuit to be driven in the ascending order of the temperatures of the switching elements from among the power conversion circuits in which the temperatures of the switching elements are lower than the predetermined temperature threshold value. When a total permissible current value of all of the power conversion circuits in each of which the temperature of the switching element is lower than the predetermined temperature threshold value is lower than the one of the supplied current value and the target output current value, the controller may be configured to select all of the power conversion circuits. In this case as well, the load distribution can be effectuated by selecting all of the power conversion circuits when the power conversion circuit including the switching element with the temperature higher than the temperature threshold value must be used.

Each power conversion circuit may comprise a plurality of switching element, in which the controller may be configured to compare the lowest one of the temperatures of the switching elements included in each of the power conversion circuits with the temperatures of the switching elements included in another power conversion circuit. In other words, in a case where a power conversion circuit includes a switching element with a high temperature and a switching element with a low temperature, the controller may be configured to compare the lower one of the temperatures with the temperatures of the switching elements of other power conversion circuits. By processing as above, the power conversion circuit including the switching element with the low temperature can be driven with priority.

Details and further improvements of the technique disclosed herein will be described in Detailed Description below.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide an improved power converter, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

Figure 1:
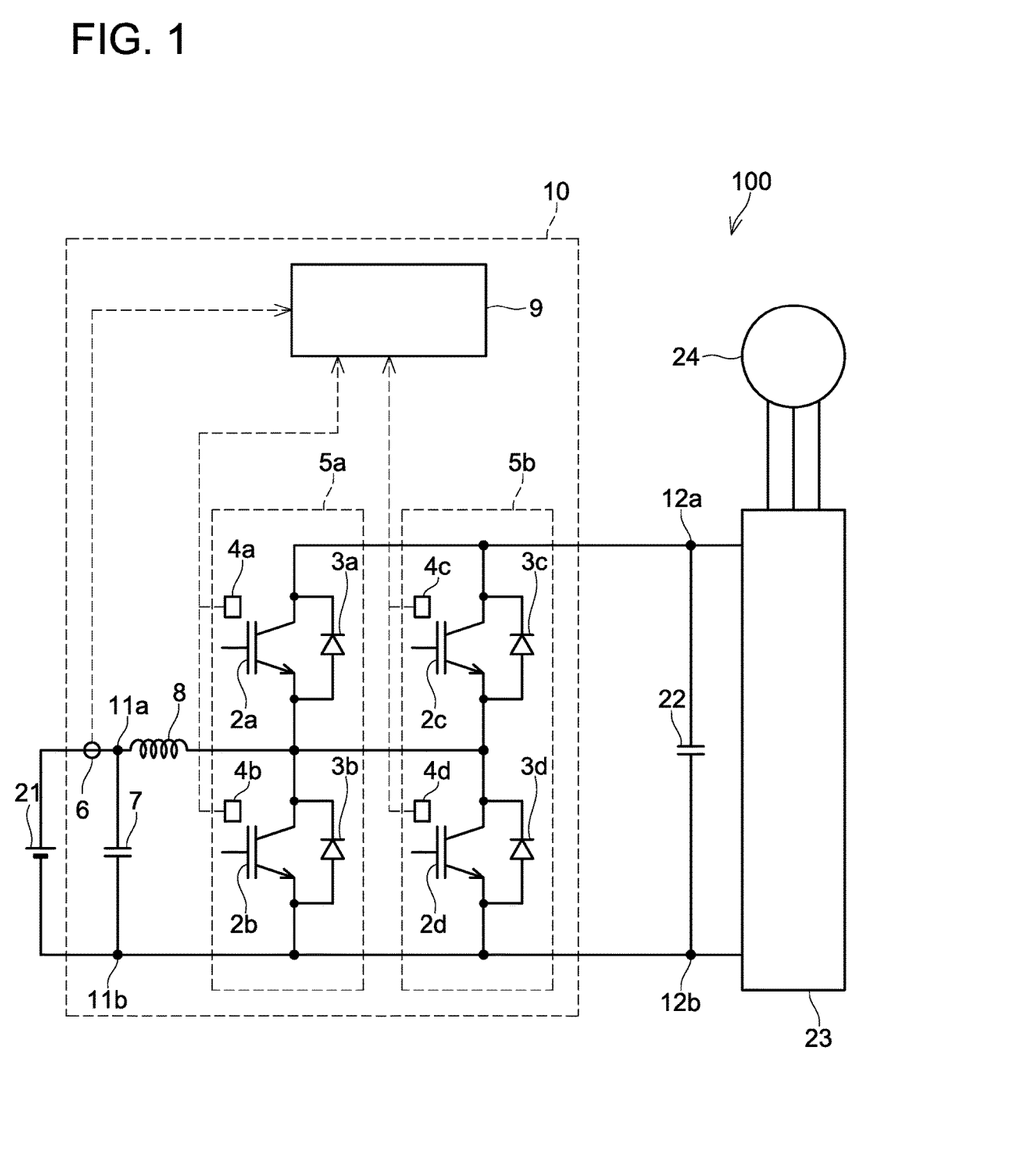
FIG. 1 is a block diagram of a power system of an electric vehicle including a power converter of a first embodiment.

A power converter of a first embodiment will be described with reference to FIGS. 1 and 2. The power converter of the first embodiment is installed in an electric vehicle. FIG. 1 shows a block diagram of a power system of an electric vehicle 100 including a power converter 10.

The electric vehicle 100 runs on a motor 24. The motor 24 is an AC motor. The motor 24 may in some case function as a generator. When a driver steps on a brake, the electric vehicle 100 generates electric power by driving the motor 24 in reverse by inertia energy of a vehicle body. The electric power generated by driving the motor 24 in reverse is called regenerative electric power.

The electric vehicle 100 comprises a battery 21, a power converter 10, an inverter 23, and the motor 24. The power converter 10 boosts a voltage of output power of the battery 21 and supplies the same to the inverter 23. The power converter 10 also has a function to step down a voltage of the regenerative electric power and supply the same to the battery 21. That is, the power converter 10 is a bidirectional DC-DC converter. The battery 21 is charged by the regenerative electric power stepped down by the power converter 10. A circuit structure of the power converter 10 will be described later in detail.

The inverter 23 converts DC power supplied from the power converter 10 to AC power suitable for driving the motor 24 and supplies the same to the motor 24. The inverter 23 also has a function to convert the regenerative electric power (AC) generated by the motor 24 to DC power and supply the same to the power converter 10. A circuit configuration of the inverter 23 is well known, so a detailed circuit diagram and explanation thereof will be omitted. A capacitor 22 is connected in parallel between the power converter 10 and the inverter 23. The capacitor 22 smoothes a current flowing between the power converter 10 and the inverter 23.

The power converter 10 and the inverter 23 operate by receiving instructions from a host controller that is not shown. The host controller determines a voltage ratio of a low-voltage side and a high-voltage side of the power converter 10 and an AC power frequency of the inverter 23 in accordance with a vehicle speed, accelerator pedal effort, and brake pedal effort. The host controller instructs the determined voltage ratio to the power converter 10 and instructs the determined frequency to the inverter 23.

A circuit structure of the power converter 10 will be described. The power converter 10 comprises two pairs of power conversion circuits 5a, 5b, a reactor 8, a capacitor 7, a current sensor 6, and a controller 9. The two pairs of power conversion circuits 5a, 5b are connected in parallel. The two pairs of power conversion circuits 5a, 5b share the reactor 8 and the capacitor 7. The reactor 8 and the capacitor 7 are a part of the power conversion circuits, however, they are shared components, so they are depicted outside broken line rectangles indicating the power conversion circuits 5a, 5b in FIG. 1. Reference signs 11a and 11b respectively indicate low voltage-side positive terminal and negative terminal of the power converter 10. Reference signs 12a and 12b respectively indicate high voltage-side positive terminal and negative terminal of the power converter 10. The reference signs 11a and 11b will respectively be termed a low-voltage positive terminal and a low-voltage negative terminal, and the reference signs 12a and 12b will respectively be termed a high-voltage positive terminal and a high-voltage negative terminal. The low-voltage positive terminal 11a and the low-voltage negative terminal 11b will collectively be termed low-voltage terminals 11, and the high-voltage positive terminal 12a and the high-voltage negative terminal 12b will collectively be termed high-voltage terminals 12. The low-voltage negative terminal 11b and the high-voltage negative terminal 12b are directly connected.

A first power conversion circuit 5a will be described. The first power conversion circuit 5a comprises two switching elements 2a, 2b, two diodes 3a, 3b, two temperature sensors 4a, 4b, the reactor 8, and the capacitor 7. As aforementioned, the reactor 8 and the capacitor 7 are shared with the other power conversion circuit 5b, so they are depicted outside the broken line rectangle indicating the first power conversion circuit 5a in FIG. 1, however, it should be noted that they are constituent components of the first power conversion circuit 5a.

The two switching elements 2a, 2b are connected in series. A series connection of the two switching elements 2a, 2b is connected between the high-voltage positive terminal 12a and the high-voltage negative terminal 12b. The switching elements 2a, 2b are switching elements for converting electric power, and are for example insulated gate type bipolar transistors (IGBTs). The diode 3a is connected in inverse parallel to the switching element 2a, and the diode 3b is connected in inverse parallel to the switching element 2b. The temperature sensors 4a, 4b are arranged respectively for the switching elements 2a, 2b. The temperature sensor 4a measures a temperature of the switching element 2a, and the temperature sensor 4b measures a temperature of the switching element 2b. The temperature sensor 4a (or 4b) may be incorporated in the switching element 2a (or 2b), or may be arranged in a vicinity of the switching element 2a (or 2b). Alternatively, the temperature sensor 4a (or 4b) may be a type which estimates the temperature of the switching element from a refrigerant temperature in a cooler that cools the switching element 2a (or 2b).

The reactor 8 is connected between a midpoint of the series connection of the two switching elements 2a, 2b and the low-voltage positive terminal 11a. The capacitor 7 is connected between the low-voltage positive terminal 11a and the low-voltage negative terminal 11b. The current sensor 6 is arranged on a power line connected to the reactor 8. The current sensor 6 measures a current flowing in the reactor 8, that is, the current flowing in the power converter 10.

As aforementioned, the power converter 10 is a bidirectional DC-DC converter. The switching element 2a on a high-voltage positive terminal 12a side is involved in a voltage step-down operation, and the switching element 2b on a high-voltage negative terminal 12b side is involved in a voltage boosting operation. The voltage step-down operation will be described. When the switching element 2a turns on, the electric power flows from the high-voltage positive terminal 12a to the reactor 8. Since the reactor 8 and the capacitor 7 stores a part of the electric power, a voltage that is lower than the high-voltage positive terminal 12a is exhibited on the low-voltage positive terminal 11a. When the switching element 2a turns off, the high-voltage positive terminal 12a is cut off from the reactor 8. Electric energy stored in the reactor 8 and the capacitor 7 flows back through the diode 3b, and the voltage of the low-voltage positive terminal 11a is thereby maintained. The electric power applied to the high-voltage terminals 12 is stepped down by appropriate iteration of the switching element 2a turning on and off, and the stepped down electric power is outputted from the low-voltage terminals 11.

The boost operation will be described. When the switching element 2b turns on, a closed circuit constituted of the reactor 8, the switching element 2b, and the capacitor 7 is formed, and electric energy is stored in the capacitor 7 and the reactor 8. When the switching element 2b turns off, the electric energy stored in the capacitor 7 and the reactor 8 is released, by which the output voltage of the battery 21 is boosted up. As a result, the high-voltage positive terminal 12a exhibits a voltage higher than the voltage of the battery 21. The current upon boosting flows from the low-voltage positive terminal 11a to the high-voltage positive terminal 12a through the diode 3a. The electric power applied to the low-voltage terminals 11 is boosted by appropriate iteration of the switching element 2b turning on and off, and the boosted electric power is outputted from the high-voltage terminals 12.

The switching elements 2a, 2b are driven by the controller 9. The controller 9 provides the switching elements 2a, 2b with complementary PWM signals (drive signals) with a predetermined duty ratio. "Providing the complementary PWM signals" means that a signal of which level is inverted from the PWM signal to be provided to one of the switching elements is provided to the other switching element. By providing the complementary PWM signals to the respective switching elements, the boost operation and the step-down operation passively switch between them according to an electric power balance between the low-voltage terminals 11 and the high-voltage terminals 12. That is, when the inverter 23 operates so that the motor 24 outputs torque, the power conversion circuit 5a boosts the voltage of the battery 21 and outputs it from the high-voltage terminals 12. When the regenerative electric power (DC) is applied to the high-voltage terminals 12, the power conversion circuit 5a steps down the regenerative electric power and outputs it from the low-voltage terminals 11. The duty ratio is set based on a target voltage ratio between the low-voltage terminals 11 and the high-voltage terminals 12.

As aforementioned, the temperature sensor 4a measures the temperature of the switching element 2a and the temperature sensor 4b measures the temperature of the switching element 2b. The measured temperatures of the temperature sensors 4a, 4b are sent to the controller 9. The current value which the current sensor 6 measures is also sent to the controller 9.

The second power conversion circuit 5b has a same circuit structure as the first power conversion circuit 5a. Switching elements 2c, 2d, diodes 3c, 3d, and temperature sensors 4c, 4d of the second power conversion circuit 5b correspond respectively to the switching elements 2a, 2b, the diodes 3a, 3b, and the temperature sensors 4a, 4b of the first power conversion circuit 5a. The temperature sensor 4c measures a temperature of the switching element 2c and the temperature sensor 4d measures a temperature of the switching element 2d. The measured temperatures of the temperature sensors 4c, 4d are sent to the controller 9.

The controller 9 receives an instruction of the target voltage ratio from the host controller, and generates the PWM signals (drive signals) for the respective switching elements 2a to 2d of the power conversion circuits 5a, 5b so that the target voltage ratio can be realized. The generated drive signals are supplied to the respective switching elements. The power conversion circuits 5a, 5b have the same circuit configuration and are connected in parallel. Although the power conversion circuits 5a, 5b have the same circuit configuration, their breakdown voltages may differ depending on the temperatures of the switching elements 2a to 2d. Generally, it is known that the breakdown voltage of the switching element may be going down as the temperature of the switching element goes down below a predetermined temperature. For example, in a case where the temperature of the switching element 2a in the first power conversion circuit 5a is extremely lower than the temperature of the other switching element, the first power conversion circuit 5a cannot be used to flow large current due to its risk of breakdown. As a result, the controller 9 is forced to use the second power conversion circuit 5b with priority, and the temperatures of the switching elements in the first power conversion circuit 5a drop even further. In order not to enter such an undesirable spiral, the controller 9 selects the power conversion circuit to be driven in accordance with the temperatures of the switching elements so that a temperature of a particular switching element does not drop extremely.

Figure 2:
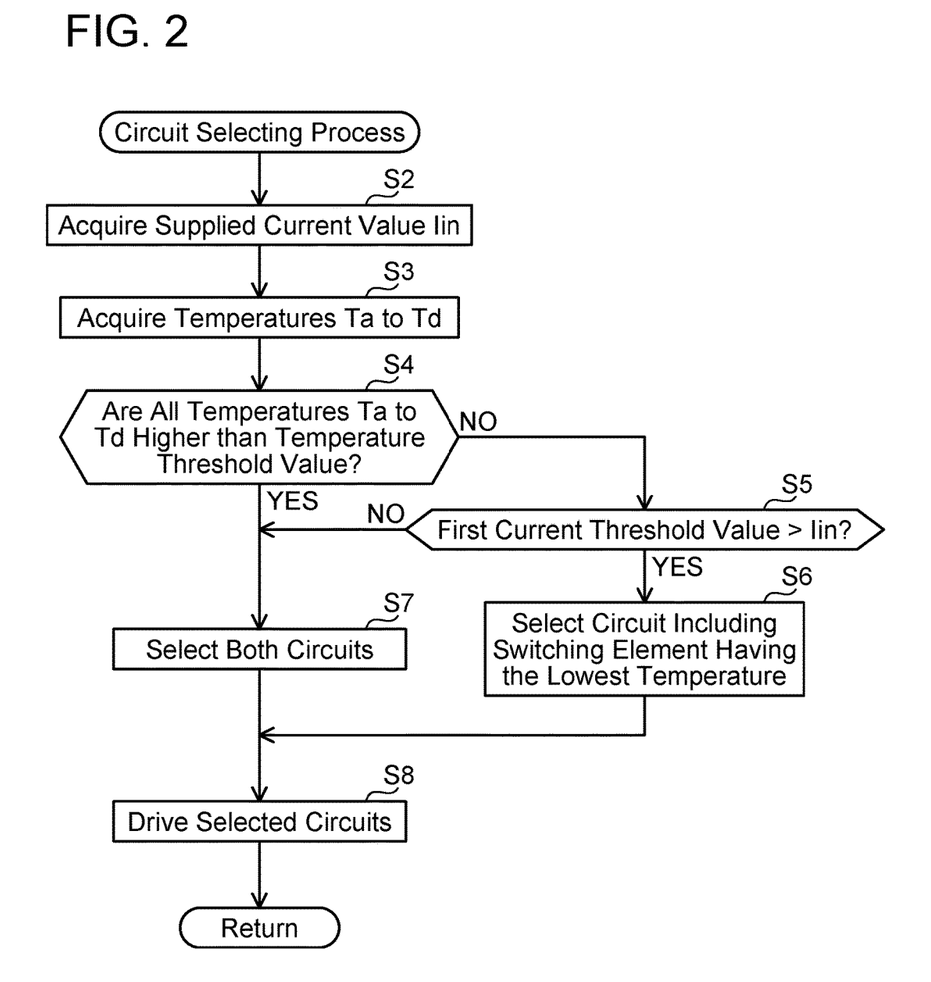
FIG. 2 is a flowchart of a circuit selecting process which a controller executes (first embodiment).

FIG. 2 shows a flowchart of a circuit selecting process performed by the controller 9. The controller 9 firstly acquires the current value (supplied current value Iin) supplied to the power converter 10 from the current sensor 6 (step S2). The current supplied to the power converter 10 includes both the current from the battery 2 and regenerative current from the motor 24. Both of such currents flow through the current sensor 6. The measured current of the current sensor 6 corresponds to the supplied current value Iin.

Next, the controller 9 acquires the temperatures of all the switching elements 2a to 2d in the power conversion circuits 5a, 5b from the temperature sensors 4a to 4d (step S3). Hereinbelow, the temperatures of the switching elements 2a, 2b, 2c, 2d will be termed temperatures Ta, Tb, Tc, Td, respectively. Further, "circuit(s)" in the flowchart of FIG. 2 means the power conversion circuits 5a, 5b.

Next, the controller 9 checks whether or not all the temperatures Ta to Td are higher than a predetermined temperature threshold value (step S4). The temperature threshold value is set to a temperature by which a sufficient breakdown voltage can be ensured if the temperature of the switching element is higher than this temperature. In a case where all the temperatures Ta to Td are higher than the temperature threshold value (step S4: YES), the controller 9 selects all power conversion circuits 5a, 5b (step S7), and drives the selected power conversion circuits 5a, 5b (step S8). In the case where the temperatures of all the switching elements are higher than the temperature threshold value, there is no need to heat up a particular switching element, and it is effective to distribute the load equally over all the power conversion circuits. The controller 9 supplies same PWM signals to the power conversion circuit 5a and to the power conversion circuit 5b so that the current flows equally through all the power conversion circuits 5a, 5b.

In a case where the temperature of at least one of the switching elements is lower than the temperature threshold value (step S4: NO), the controller 9 compares the supplied current value Iin and a first current threshold value (step S5). Here, the first current threshold value is set to a current value which is allowable for flowing one power conversion circuit. The first current threshold value may be set to a value which is obtained by subtracting a margin (a predetermined allowance for allowing error and the like) from the current value which one power conversion circuit is capable of allowing. In a case where the supplied current value Iin is lower than the first current threshold value (step S5: YES), the controller 9 selects the power conversion circuit including the switching element having the lowest temperature (step S6). Then, the controller 9 drives the selected power conversion circuit (step S8).

On the other hand, in a case where the supplied current value Iin is higher than the first threshold value (step S5: NO), the controller 9 selects all power conversion circuits 5a, 5b since usage of only one power conversion circuit is not enough to flow the supplied current value Iin (step S7). Then, the controller 9 drives the selected power conversion circuits (step S8). In this case, the controller 9 supplies the same drive signals to the respective power conversion circuits 5a, 5b so that the total load is equally distributed on both power conversion circuits 5a, 5b.

The controller 9 periodically performs the process of FIG. 2 (circuit selecting process). By the process of FIG. 2, the power conversion circuit including the switching element with the low temperature is driven with priority. By being driven with priority, the switching element of which temperature had been low is heated by the heat generation of itself, and the decreasing of the breakdown voltage can be prevented. The process of FIG. 2 prevents a situation in which the temperature of one of the switching elements is extremely lower compared to the temperatures of other switching elements. Thus, in the two power conversion circuits 5a, 5b, the temperature-dependent variation in the breakdown voltage can be suppressed.

Second Embodiment

Figure 3:
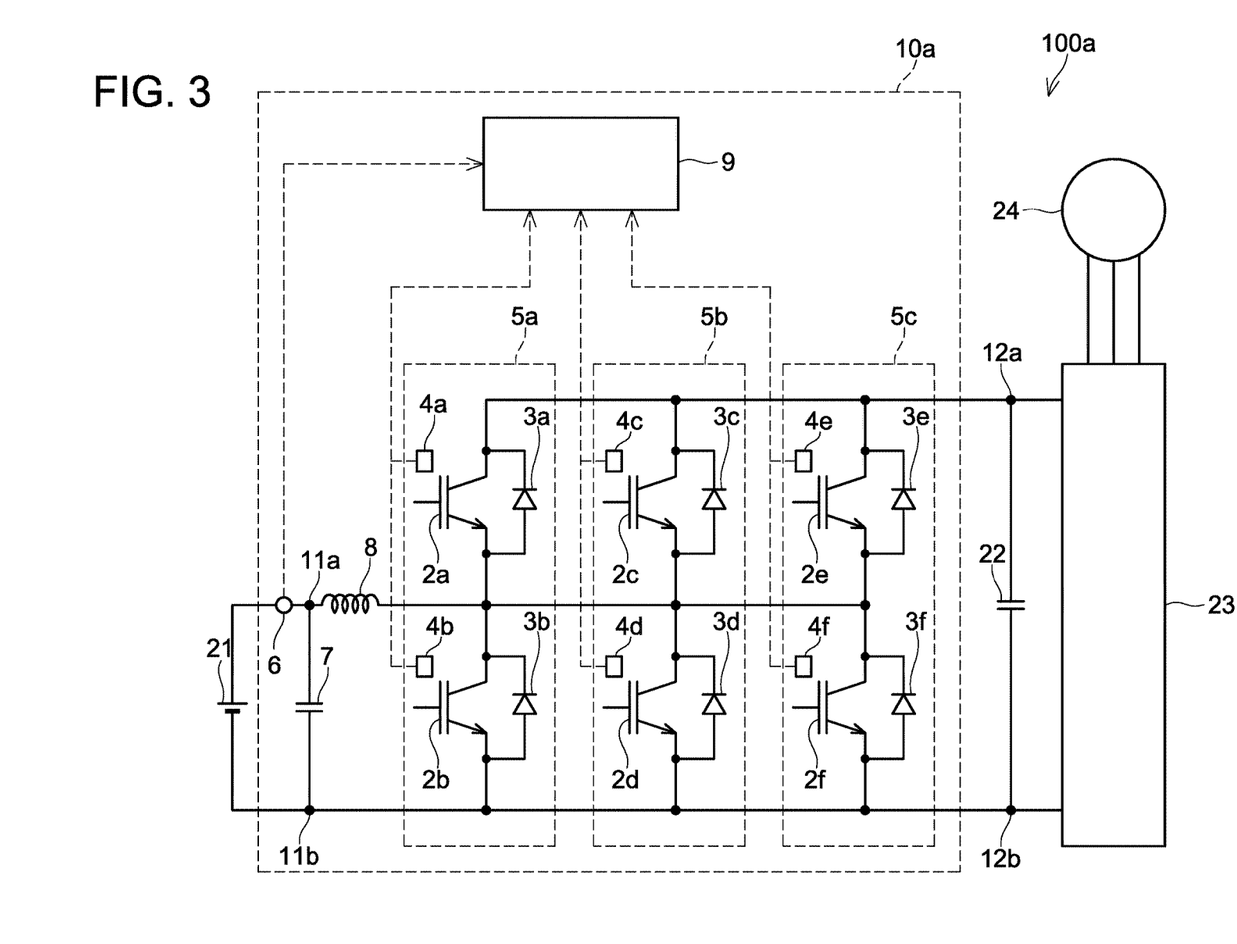
FIG. 3 is a block diagram of a power system of an electric vehicle including a power converter of a second embodiment.

Next, a power converter of a second embodiment will be described with reference to FIGS. 3 to 6. FIG. 3 shows a block diagram of a power system of an electric vehicle 100a including a power converter 10a of the second embodiment. A feature differing from the first embodiment is that the power converter 10a comprises three sets of power conversion circuits 5a to 5c. The power converter 10 of FIG. 1 and the power converter 10a of FIG. 3 are same except for the third power conversion circuit 5c. A circuit structure of the third power conversion circuit 5c is same as the structure of the first power conversion circuit 5a.

Switching elements 2e, 2f, diodes 3e, 3f, and temperature sensors 4e, 4f of the third power conversion circuit 5c correspond respectively to the switching elements 2a, 2b, the diodes 3a, 3b, and the temperature sensors 4a, 4b of the first power conversion circuit 5a. The temperature sensor 4e measures a temperature of the switching element 2e and the temperature sensor 4f measures a temperature of the switching element 2f. The measured temperatures of the temperature sensors 4e, 4f are sent to the controller 9.

Figure 4:
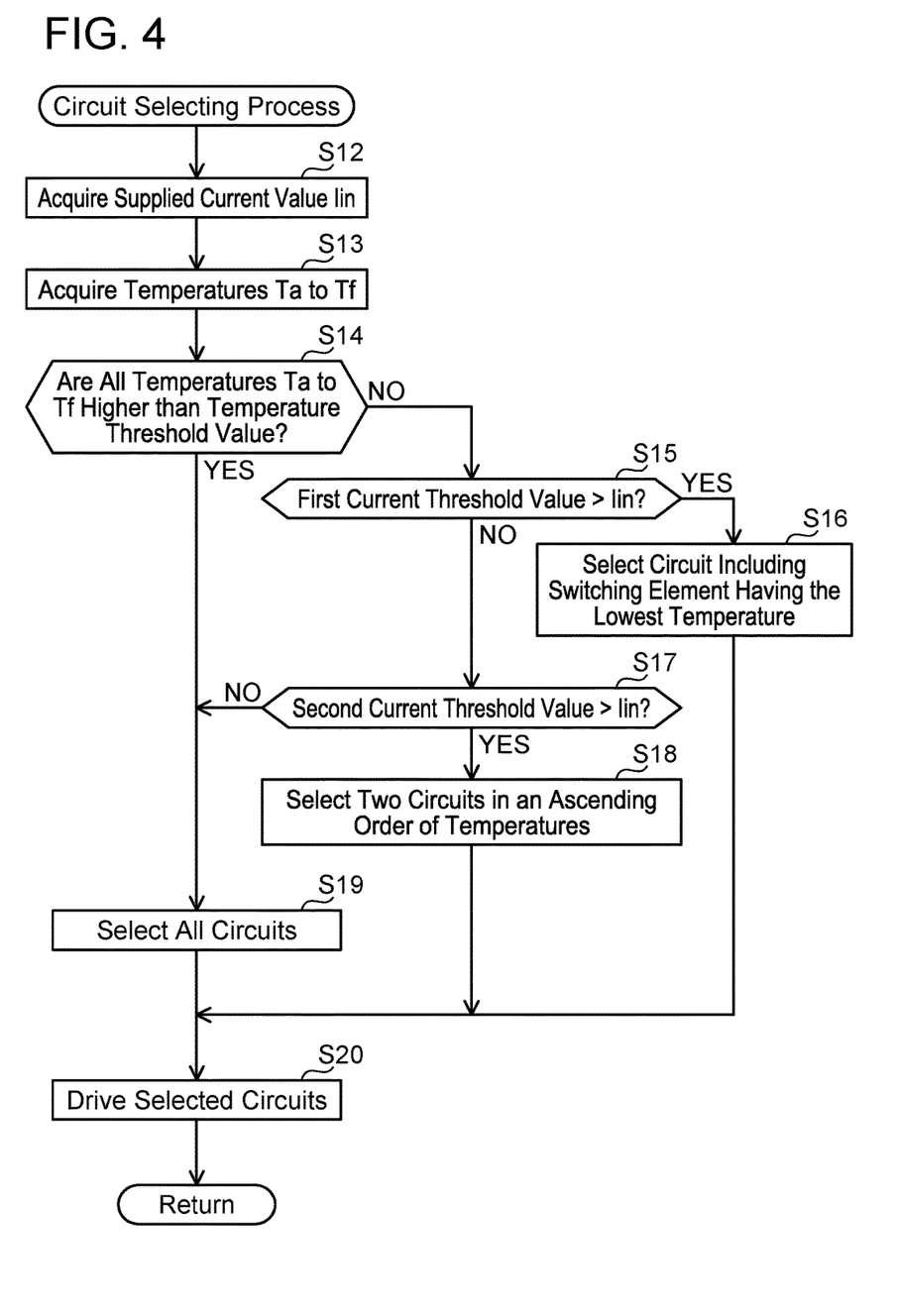
FIG. 4 is a flowchart of a circuit selecting process which a controller executes (second embodiment).

The controller 9 selects the power conversion circuit to be driven based on the supplied current value Iin to the power converter 10a and the temperatures of the switching elements in the respective power conversion circuits 5a to 5c and drives the same. FIG. 4 shows a flowchart of the circuit selecting process performed by the controller 9 of the power converter 10a. The temperatures of the switching elements 2a, 2b, 2c, 2d, 2e, 2f will be termed temperatures Ta, Tb, Tc, Td, Te, Tf, respectively. Further, "circuit(s)" in the flowchart of FIG. 4 means the power conversion circuits 5a, 5b, 5c.

Steps S12, S13, S14, S19, S20 in FIG. 4 correspond respectively to steps S2, S3, S4, S7, S8 in FIG. 2. That is, the controller 9 acquires the supplied current value Iin (step S12), acquires the temperatures Ta to Tf of the switching elements 2a to 2f (step S13), and checks whether or not all the temperatures are higher than the temperature threshold value (step S14). Then, in the case where all the temperatures are higher than the temperature threshold value (step S14: YES), the controller 9 selects all the power conversion circuits 5a to 5c (step S19), and drives the selected power conversion circuits 5a to 5c (step S20). The temperature threshold value is set to a temperature that can ensure sufficient breakdown voltage, similar to the case of the first embodiment. In the case where all the temperatures are higher than the temperature threshold value (step S14: YES), there is no need to drive a particular switching element with priority so that the particular switching element can be heated. In such a case, all the power conversion circuits are driven to distribute the load.

In the case where the temperature of at least one switching element is lower than the temperature threshold value (step S14: NO), the controller 9 compares the supplied current value Iin with the first current threshold value (step S15). The first current threshold value is set to a current value which one power conversion circuit is capable of allowing, similar to the case of the first embodiment. Alternatively, the first current threshold value may be set to a value which is obtained by subtracting a predetermined margin from the current value which one power conversion circuit is capable of allowing. In the case where the supplied current value Iin is lower than the first current threshold value (step S15: YES), the controller 9 selects the power conversion circuit including the switching element having the lowest temperature (step S16). Then, the controller 9 drives the selected power conversion circuit (step S20).

On the other hand, in the case where the supplied current value Iin is higher than the first threshold value (step S15: NO), the usage of only one power conversion circuit is not enough to flow the supplied current value Iin. In this case, the controller 9 compares the supplied current value Iin with a second current threshold value (step S17). The second current threshold value is set to a total permissible current value of two power conversion circuits (or a value that is obtained by subtracting a margin from the total permissible current value). In a case where the supplied current value Iin is lower than the second current threshold value (step S17: YES), the controller 9 selects two power conversion circuits in an ascending order of the temperatures (step S18). Then, the controller 9 drives the selected power conversion circuits (step S20). "Selecting two power conversion circuits in an ascending order of the temperatures" more accurately means that the two power conversion circuits are selected in the order of having lower temperature of the switching elements included therein.

On the other hand, in a case where the supplied current value Iin is higher than the second current threshold value (step S17: NO), a combination of two power conversion circuits cannot handle the supplied current value Iin. In this case, the controller 9 selects all three power conversion circuits 5a to 5c (step S19), and drives the selected power conversion circuits (step S20).

Figure 5:
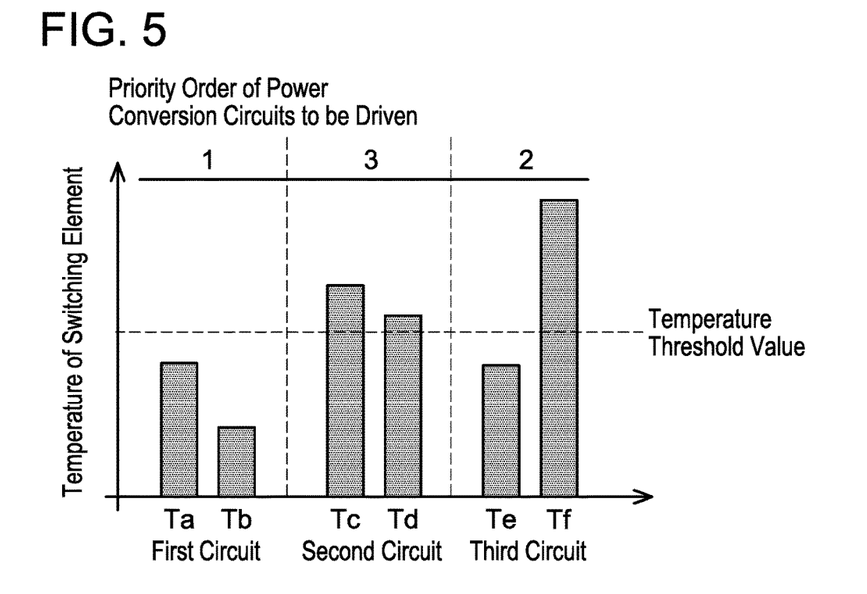
FIG. 5 is a graph indicating an example of a switching element temperature distribution.

An example of a temperature distribution of the switching elements 2a to 2f is shown in FIG. 5. Ta to Tf in a horizontal axis indicate the temperatures of the switching elements 2a to 2f, respectively. A "first circuit", a "second circuit", and a "third circuit" in the horizontal axis indicate the first power conversion circuit 5a, the second power conversion circuit 5b, and the third power conversion circuit 5c, respectively. In the example of FIG. 5, the temperature Tb of the switching element 2b in the first power conversion circuit 5a is the lowest. Thus, the first power conversion circuit 5a (first circuit) is selected with priority. Specifically, the first power conversion circuit 5a is selected in the process of step S16 of FIG. 4.

In the example of FIG. 5, the temperature of the switching element 2e included in the third power conversion circuit 5c is the lowest among the remaining power conversion circuits 5b, 5c. That is, the third power conversion circuit 5c (third circuit) includes the switching element with the second lowest temperature next to that of the first power conversion circuit 5a. Thus, in the case of selecting two power conversion circuits in the temperature ascending order (step S18 in FIG. 4), the first power conversion circuit 5a (first circuit) and the third power conversion circuit 5c (third circuit) are selected. In the case where the supplied current value Iin cannot be handled with the two power conversion circuits 5a, 5c, three power conversion circuits 5a to 5c are selected (step S17: NO, S19). As a result, as shown at a top of the graph in FIG. 5, the priority order of the power conversion circuits to be driven is determined in an order of first power conversion circuit 5a (first circuit), the third power conversion circuit 5c (third circuit), and the second power conversion circuit 5b (second circuit).

Since the temperatures of the switching elements change, the temperature distribution of FIG. 5 changes in a time-dependent manner. In a case where the temperatures of all of the switching elements are lower than the temperature threshold value, the controller 9 selects all the power conversion circuits (step S14: YES, S19 in FIG. 4) regardless of the temperatures of the switching elements, since a variation in the breakdown voltages is small. Instead of such a process, the controller may specify power conversion circuits including the switching elements that are at temperatures lower than the temperature threshold value, and select the power conversion circuit to be driven in accordance with the temperature ascending order among the specified power conversion circuits. In this case, in a case where the total permissible current value of the specified power conversion circuits is lower than the supplied current value Iin, all the power conversion circuits are selected. Such a circuit selecting process will be described later with reference to FIGS. 8 and 9.

In the example of FIG. 5, each of the power conversion circuits comprises plural switching elements. In such a case, the controller 9 compares the lower one of the temperatures of each of the plural switching elements with the temperatures of the switching elements of the other power conversion circuits. In other words, in a case where one power conversion circuit comprises a switching element with a high temperature and a switching element with a low temperature, the controller 9 compares the lower one of the temperatures with the temperatures of the switching elements of the other power conversion circuits. By processing as above, the power conversion circuits with the switching elements having the lower temperatures can be driven with priority.

Figure 6:
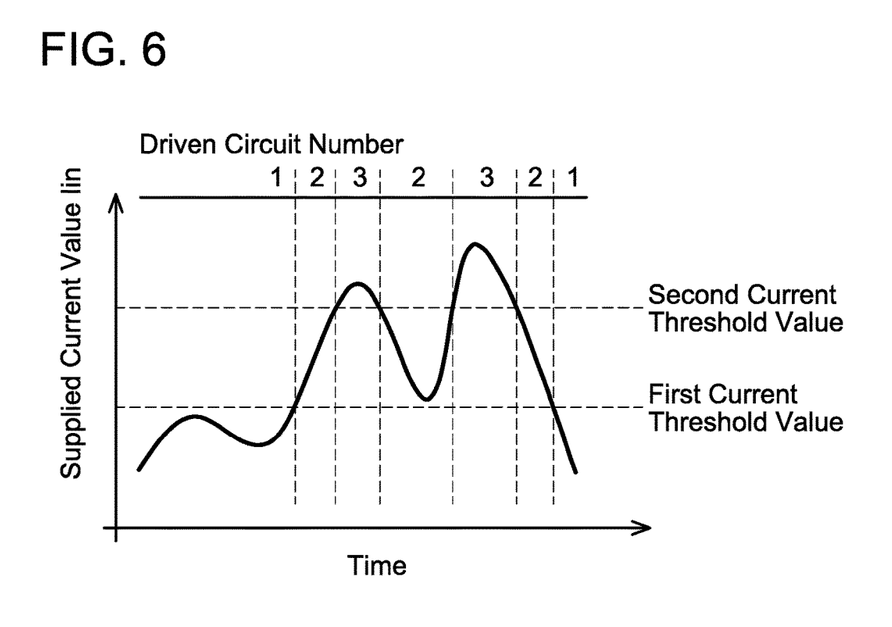
FIG. 6 is a graph indicating an example of a relationship of a change in a supplied current value Iin and a drive circuit number.

FIG. 6 shows an example of a relationship between changes in the supplied current value Iin and a drive circuit number. As shown in FIG. 6, during when the supplied current value Iin is lower than the first current threshold value, only one power conversion circuit is selected and driven. Further, in a case where the supplied current value Iin is higher than the first current threshold value but lower than the second current threshold value, two power conversion circuits are selected and driven. Moreover, in a case where the supplied current value Iin is higher than the second current threshold value, all three power conversion circuits are selected and driven. The priority order of the power conversion circuits is determined based on the temperatures of the switching elements each time the drive circuit number is determined.

The controller 9 performs the process of FIG. 4 (circuit selecting process) periodically. The process of FIG. 4 drives the power conversion circuits including the switching elements with the low temperature with priority. As a result, the variation in the temperatures among the switching elements 2a to 2f becomes smaller, and the temperature-dependent variation in the breakdown voltages can be suppressed among all the power conversion circuits 5a to 5c.

Third Embodiment

Figure 7:
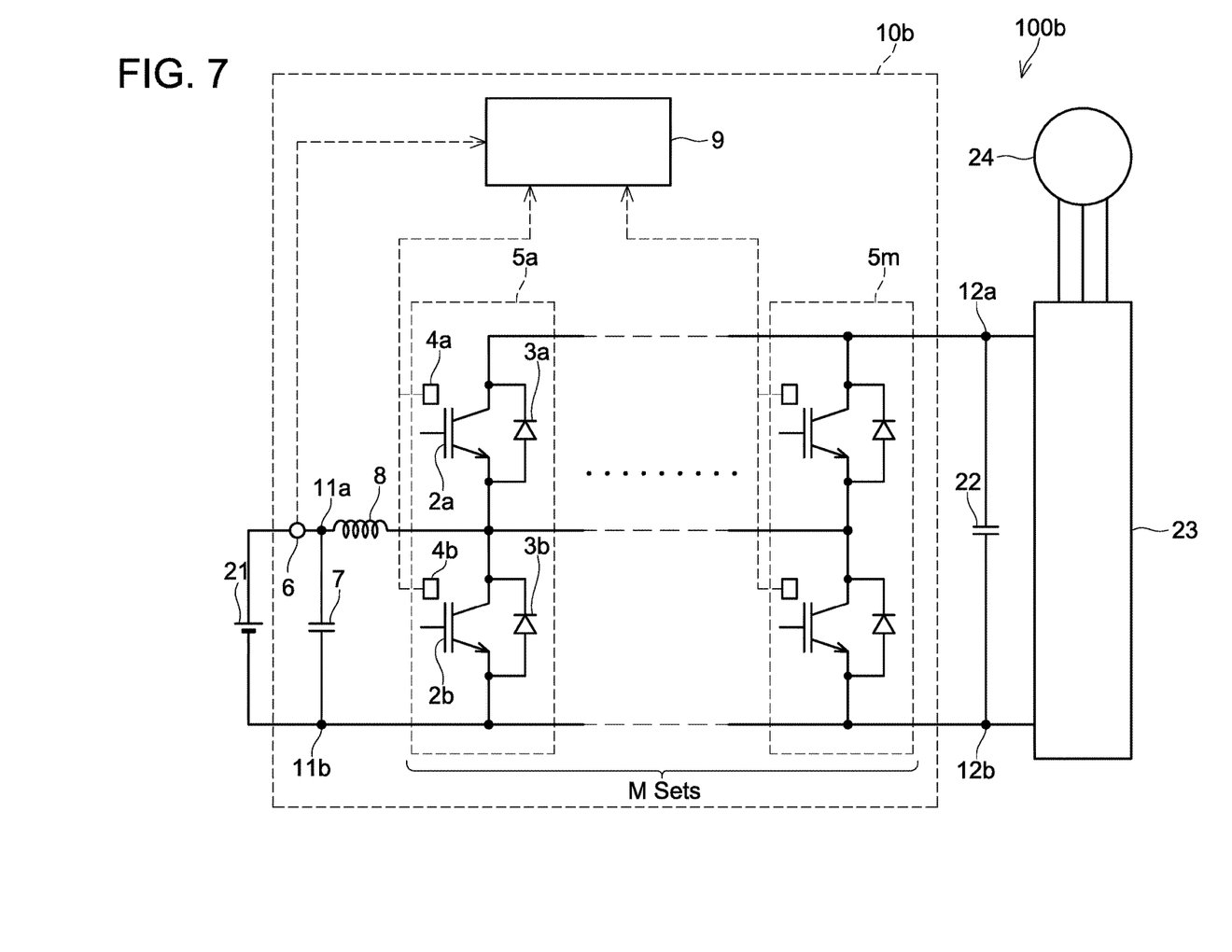
FIG. 7 is a block diagram of a power system of an electric vehicle including a power converter of a third embodiment.

A power converter of a third embodiment will be described with reference to FIGS. 7 to 9. The power converter of the third embodiment is installed in an electric vehicle 100b. FIG. 7 shows a block diagram of the electric vehicle 100b including a power converter 10b of the third embodiment. As compared to the power converter 10a shown in FIG. 4 having three power conversion circuits, the power converter 10b of the third embodiment differs in having M sets of power conversion circuits 5a to 5m. In the power converter 10b of the third embodiment, a configuration of each power conversion circuit is same as the configuration of the first power conversion circuit 5a, and it is the same as the power converter 10 of the first embodiment except for the number of the power conversion circuits. Thus, depiction of circuits of power conversion circuits 5b to 5(m−1) is omitted in FIG. 7, and reference signs for respective elements in the power conversion circuit 5m are also omitted.

Figure 8:
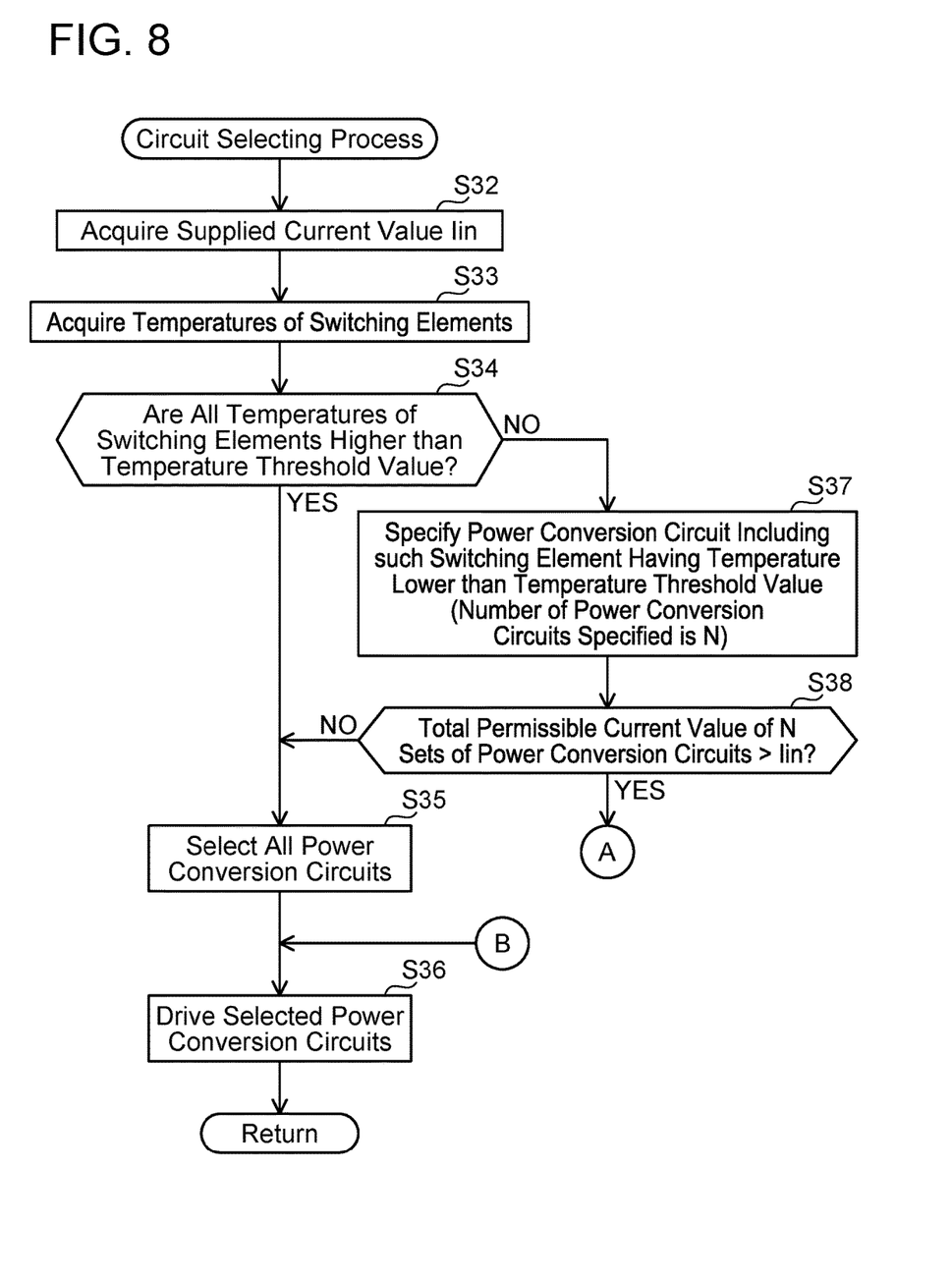
FIG. 8 is a flowchart of a circuit selecting process which a controller executes (third embodiment).
Figure 9:
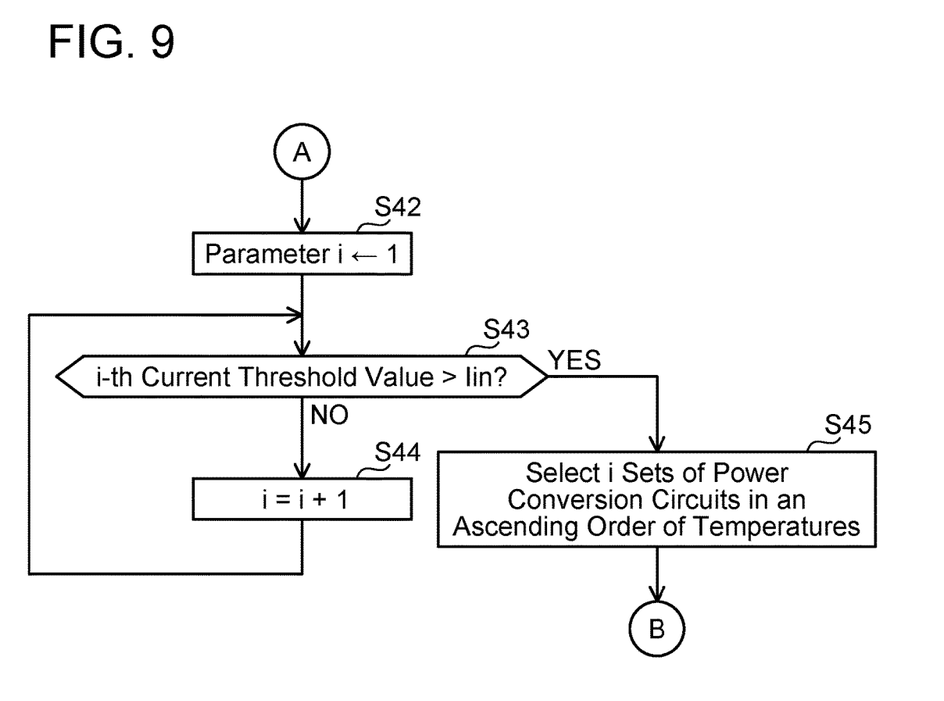
FIG. 9 is a flowchart of the circuit selecting process which the controller executes (third embodiment, continuation of FIG. 8).

FIGS. 8 and 9 show flowcharts of the circuit selecting process performed by the controller 9 of the power converter 10b of the third embodiment. Processes of steps S32, S33, S34, S35, S36 correspond respectively to steps S12, S13, S14, S19, S20 of the second embodiment (FIG. 4), so the descriptions thereof will be omitted.

In a process of step S34, in the case where the temperature of at least one switching element is lower than the temperature threshold value (step S34: NO), the controller 9 specifies the power conversion circuit including such a switching element having the temperature lower than the temperature threshold value (step S37). The number of the power conversion circuits specified herein is denoted "N". Next, the controller 9 compares the total permissible current value of the N sets of power conversion circuits with the supplied current value Iin (step S38). In the case where the total permissible current value of the N sets of power conversion circuits is lower than the supplied current value Iin (step S38: NO), the controller 9 selects all the power conversion circuits (step S35), and drives the selected power conversion circuits (step S36). Here, the "total permissible current value" may similarly be a value that is obtained by subtracting the margin from the current value which the selected N sets of the power conversion circuits are capable of allowing.

On the other hand, in the case where the total permissible current value of the N sets of power conversion circuits is higher than the supplied current value Iin (step S38: YES), the controller 9 proceeds the process to step S42 of FIG. 9. In this case where the determination of step S38 is YES, this means that the supplied current value Iin can be handled only by the power conversion circuits including such a switching element with the low temperature.

In step S42, a software-based parameter i is introduced. An initial value of the parameter i is "1" (step S42). The controller 9 performs the determination of step S43 while incrementing the parameter i (steps S43, S44, S43). In step S43, the controller 9 compares an i-th current threshold value and the supplied current value Iin. Here, the i-th current threshold value means a total permissible current value of i sets of power conversion circuits. In a case where the i-th current threshold value is higher than the supplied current value Iin (step S43: YES), the controller 9 selects i sets of power conversion circuits in an ascending order of the temperatures (step S45). Then, the controller 9 drives the selected power conversion circuits (FIG. 8, step S36). The controller 9 supplies the same drive signal to the selected power conversion circuits to cause their switching elements with the low temperature to generate heat and be heated up thereby.

In the process of step S38, since the total permissible current value of the specified N sets of power conversion circuits is confirmed as being higher than the supplied current value Iin, the iteration process of step S44 always shifts to step S45 in a situation where i is a value that is equal to or lower than N.

The overview of the processes performed by the controller 9 of the third embodiment will be summarized. From among the M sets of power conversion circuits 5a to 5m, the controller 9 specifies the circuit including the switching element having the temperature lower than the predetermined temperature threshold value. The number of specified circuits is N sets (N≤M). The controller 9 selects the power conversion circuit to be driven in the ascending order of the temperatures of the switching elements from among the specified N sets of power conversion circuits. In the case where the total permissible current value of the specified N sets of power conversion circuits is lower than the supplied current value Iin, the controller 9 selects all the power conversion circuits. This power converter utilizes the power conversion circuits in each of which the temperature of the switching element is lower than the temperature threshold value with priority in the ascending order of the temperatures. By performing such selection of the power converter circuits, a variation in the breakdown voltages among the power conversion circuits may be reduced. On the other hand, in the case where the supplied current value Iin cannot be handled even by all the power conversion circuits including the switching elements with the low temperatures, all the power conversion circuits are selected regardless of the temperatures of their switching elements. In other words, in the case where the power conversion circuits that do not need to have their temperatures raised with priority must be used, all of the power conversion circuits are selected. By such a process, the better load distribution can be achieved.

In the block diagram of FIG. 7, the number of the power conversion circuits is denoted as M sets, the reference sign 5a is given to the power conversion circuit on the left end, and the reference sign 5m is given to the power conversion circuit on the right end. The reference signs given to the power conversion circuits in the drawing are merely for convenience, and the number M of the power conversion circuits can freely be set.

Some features of the techniques described in the embodiments will be described. The i-th current threshold value (including the first and second current threshold values) means the total permissible current value of the i sets of power conversion circuits. Here, the i-th current threshold value may be a value which is obtained by taking the variation of the permissible current value and/or the safety margin into consideration. That is, the i-th current threshold value may be a value that is obtained by subtracting a predetermined margin from the total permissible current value of the i sets of power conversion circuits. Even with such a value, the i-th current threshold value as its technical concept indicates the total permissible current value of the i sets of power conversion circuits.

The power converter of the embodiments selects the power conversion circuit(s) to be driven based on the supplied current value Iin. Instead of the supplied current value Iin, the power conversion circuits) may be selected based on the target output current value Iref of the power converter. The circuit selecting process for this case can simply replace the "supplied current value Iin" in FIGS. 2, 4, 8, and 9 by "target output current value Iref". Further, the target output current value Iref may in some cases be given from the host controller. The target output current value Iref may be determined by the controller 9 in the power converter.

The power conversion circuits provided in the power converter of the embodiments are bidirectional DC-DC converters. The technique disclosed herein may be applied to power converters provided with different types of power conversion circuits. As examples of such power conversion circuits, step-up converters, step-down converters, and inverters may be given.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A power converter comprising:
    a plurality of power conversion circuits connected in parallel, each of the power conversion circuits including a switching element that is configured to convert electric power;
    a plurality of temperature sensors each configured to measure a temperature of one of the switching elements; and
    a controller configured to turn on a power conversion circuit from among the power conversion circuits, the controller being configured to:
        turn on the power conversion circuit in an ascending order of the temperatures of the switching elements measured by the temperature sensors, based on one of a supplied current value supplied to the power converter and a target output current value of the power converter; and
        turn on all of the power conversion circuits when each of the temperatures of all of the switching elements is higher than a predetermined temperature threshold value.

2. The power converter of claim 1, wherein each power conversion circuit comprises a plurality of the switching element, and the controller is configured to compare a lowest one of temperatures of the switching elements included in each of the power conversion circuits with temperatures of the switching elements included in another power conversion circuit.

3. A power converter comprising:
    a plurality of power conversion circuits connected in parallel, each of the power conversion circuits including a switching element that is configured to convert electric power;
    a plurality of temperature sensors each configured to measure a temperature of one of the switching elements; and
    a controller configured to turn on a power conversion circuit from among the power conversion circuits, the controller being configured to:
        turn on the power conversion circuit in an ascending order of the temperatures of the switching elements measured by the temperature sensors, based on one of a supplied current value supplied to the power converter and a target output current value of the power converter;
        turn on the power conversion circuit in the ascending order of the temperatures of the switching elements from among the power conversion circuits in which the temperatures of the switching elements are lower than the predetermined temperature threshold value; and
        when a total permissible current value of all of the power conversion circuits, in each of which the temperature of the switching element is lower than the predetermined temperature threshold value, is lower than the one of the supplied current value and the target output current value, turn on all of the power conversion circuits.

4. The power converter of claim 3, wherein each power conversion circuit comprises a plurality of the switching element, and the controller is configured to compare a lowest one of temperatures of the switching elements included in each of the power conversion circuits with temperatures of the switching elements included in another power conversion circuit.

* * * * *